BLOCKING OSCILLATOR FREQUENCY DIVIDER

Filed Aug. 18, 1961

INVENTOR
N. E. LENTZ
BY R. B. Anlis
ATTORNEY

United States Patent Office 3,108,198
Patented Oct. 22, 1963

3,108,198
BLOCKING OSCILLATOR FREQUENCY DIVIDER

Norman E. Lentz, Haverhill, Mass., assignor to Bell Telephone Laboratories, Incorporated, New York, N.Y., a corporation of New York
Filed Aug. 18, 1961, Ser. No. 132,435
5 Claims. (Cl. 307—88.5)

This invention relates to pulse-recurrence-frequency-division and more particularly to transistorized pulse divider circuits.

A significant problem in pulse-recurrence-frequency-division is obtaining relatively high reliable division ratios in a single stage divider. Conventional blocking oscillator dividers have their division ratios governed by an exponentially decaying voltage which is obtained across a capacitor and applied to the control electrode of the active device employed by the divider. The regularly recurring incoming pulses are added to the capacitor voltage and when the sum of the capacitor voltage and an incoming pulse exceeds a predetermined cut-off voltage the blocking oscillator divider is triggered. The capacitor is then charged by the control electrode current and further incoming pulses are ineffective to trigger the divider until the capacitor voltage has decayed sufficiently so that the capacitor voltage plus the pulse exceeds the cut-off voltage.

As might be expected the maximum division ratio is limited by the fact that the control electrode-current characteristics which govern the maximum voltage of the capacitor are usually not well defined and as a result there is some variation in maximum capacitor voltage. If such a circuit is used to obtain high division ratios a very slight change in the maximum capacitor voltage will result in a very large change in division ratio. In the past, therefore, it has been necessary to use multiple stage dividers in order to obtain large division ratios. Thus if a division ratio of 48 to 1 were desired, two dividers, one having a division ratio of 8 to 1 and the other having a division ratio of 6 to 1 might be employed to yield an overall division ratio of 48 to 1. This staging of dividers to obtain high division ratios increases the cost and complexity of the resulting divider.

It is an object of this invention to eliminate the need for multiple stage dividers to obtain relatively high division ratios.

It is a related object of this invention to reduce the cost and complexity of a high division ratio blocking oscillator divider.

In accordance with this invention the division ratio of the blocking oscillator is controlled by governing the dissipation of the energy stored in the output transformer of the blocking oscillator and using the presence of that energy to maintain the blocking oscillator in an "off" condition so that incoming pulses cannot trigger the blocking oscillator until the stored energy has been dissipated. Since the energy stored in the transformer is a linear function of the pulse width it is a more definite quantity than the voltage stored in the capacitor of conventional blocking oscillator dividers and greater division ratios may therefore by employed.

Figure 1:
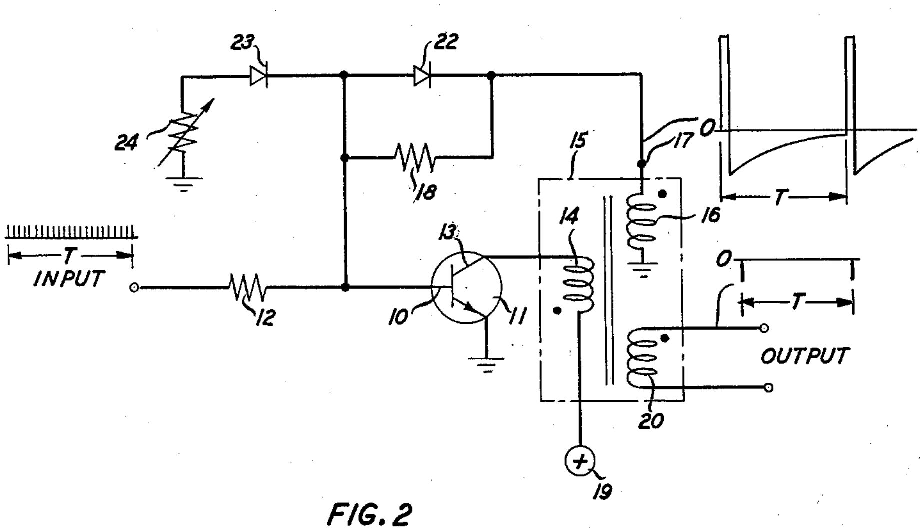
Figure 2:
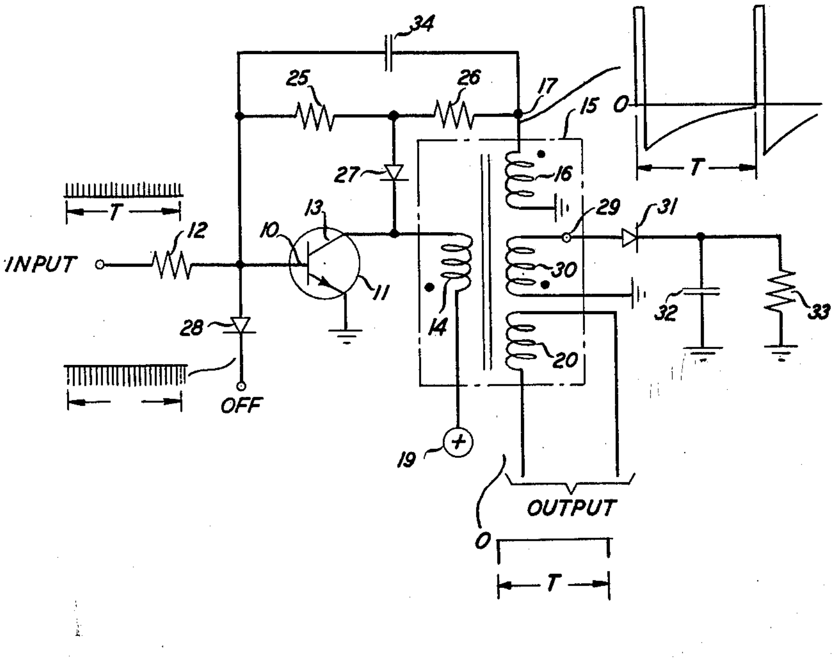

The invention will be more fully comprehended from the following detailed description taken in conjunction with the drawings, in which:

FIG. 1 is a schematic diagram of a transistorized blocking oscillator divider embodying the invention; and FIG. 2 is a schematic diagram of a transistorized counter embodying the invention.

Positive going regularly recurring pulses are applied to the base electrode 10 of n-p-n type transistor 11, shown in FIG. 1, by means of resistor 12. A first positive going pulse causes transistor 11 to conduct, which results in a drop in voltage at the collector electrode 13 which is connected to the primary winding 14 of output transformer 15. The secondary winding 16 and primary winding 14 are so wound that this decrease in voltage at collector electrode 13 results in an increase in the voltage appearing at terminal 17 of secondary winding 16. The voltage at terminal 17 is fed back to the base 10 of transistor 11 by means of resistor 18 which increases the current appearing at the base electrode 10 and drives the transistor into regions of still higher conduction. This positive feedback between the collector electrode 13 and base electrode 10 results in a regenerative action which continues until the collector electrode voltage falls so low that it can no longer drive the low impedance reflected back through the output transformer 15 from the base electrode 10. This occurs when the transformer 15 is saturated. At this time virtually all of the collector supply voltage 19 exists across the transformer primary winding 14 and the transformer has energy stored in it. Since the current absorbed by the magnetizing inductance of the transformer has been linearly increasing with time during the period of transistor conduction, the amount of energy stored in the transformer is a well-defined value; much more definite than the control electrode voltage appearing across a charged capacitor in the prior art.

At the conclusion of this regenerative process a back voltage is generated at terminal 17 and the energy stored in the transformer appears as a negative voltage at terminal 17 of secondary winding 16. In accordance with this invention the rate of dissipation of this energy controls the length of time during which input pulses applied to the base 10 of transistor 11 are not effective to turn the transistor 11 on, and the division ratio is thereby determined. The negative voltage at terminal 17 closes diodes 22 and 23 which are poled to provide easy current flow when the voltage appearing at terminal 17 is negative. Diode 22 applies the negative voltage at terminal 17 to the base 10 of transistor 11 so that the transistor is held in an "off" condition as long as a negative voltage larger in magnitude than an input pulse appears at terminal 17 of secondary winding 16. Diode 23 connects terminal 17 and base 10 to ground by means of variable resistor 24 which governs the L-R discharge time of the transformer energy. In accordance with another feature of the invention, varying the resistance of resistor 24, the discharge time of the energy stored in the transformer is varied so as to govern the "off" time of the blocking oscillator, and thereby determine the division ratio. The third winding 20 of transformer 15 provides output connections from the divider.

It is evident that while an n-p-n type transistor has been employed with positive going input pulses in the embodiment of the invention shown in FIG. 1, a p-n-p transistor could be employed to "divide" negative going input pulses.

A counter embodying the invention is shown in FIG. 2. The operation of the counter follows the same general pattern as that of the divider shown in FIG. 1. Incoming positive going regularly recurring pulses are applied to the base 10 of n-p-n type transistor 11 by means of resistor 12. A first incoming pulse turns transistor 11 on so that collector current begins to flow. This results in a drop in voltage at the collector electrode 13 which results in an increase in the voltage at terminal 17 of a secondary winding 16 of transformer 15. Positive feedback for the necessary regeneration is provided by the series combination of resistors 25 and 26 connected between terminal 17 of secondary winding 16 and the base electrode 10 of transistor 11. The transistor is prevented from entering a saturated condition by the action of diode 27 which conducts when the blocking oscillator is triggered and limits the positive feedback from terminal 17 to base electrode 10.

The "on" period is terminated by a negative going "off" pulse which closes diode 28 connected to the base 10 of transistor 11. The "off" pulses are regularly recurring pulses which are of the same pulse repetition frequency as the "on" pulses but which are spaced in time between the "on" pulses. The closing of diode 28 diverts feedback current away from the base 10 of transistor 11 and causes the collector current flow to cease.

At the conclusion of the "on" period the well defined energy stored in the transformer produces a positive voltage at terminal 29 of a secondary winding 30 of transformer 14. In accordance with this invention the rate of dissipation of this energy controls the length of time during which input pulses applied to the base 10 of transistor 11 are not effective to turn the transistor on, thereby determining how many input pulses are "counted" before another output pulse is produced. The inductance of secondary winding 30 and capacitor 32 determine the time it will take for the energy stored in the transformer to be dissipated. If it is desired that the counter perform as a decade counter, for example, capacitor 32 has a value so chosen that the energy stored is not dissipated until nine more input pulses have occurred so that the negative voltage appearing at terminal 17, representing the energy stored, is present during these nine ensuing input pulses. This negative voltage at terminal 17 is applied through the feedback path comprising resistors 25 and 26 to the base electrode 10 of transistor 11, acts as an inhibit voltage and prevents transistor 11 from turning on since resistors 25 and 26 are of low impedance. Capacitor 34 connected between terminal 17 and base electrode 10 provides a low impedance path for the high frequencies in the feedback path and thereby minimizes the rise and fall times of the output pulse. Resistor 33 provides a discharge path for the capactor 32 so that the process may be repeated.

Similarly to use the counter as a binary counter the value of capacitor 32 is so chosen that the peak of the negative voltage at terminal 17, representing the energy stored, occurs at the time of the next occurring "on" pulse. As a result, at the occurrence of the next "on" pulse a negative voltage appears at terminal 17 and this voltage acts as an inhibit voltage and prevents transistor 11 from turning on, while at the occurrence of the second "on" pulse following the "turn-off" of the transistor the energy stored in the transformer has dissipated sufficiently so that the "on" pulse turns the transistor "on" producing another output pulse.

It is to be understood that the above-described arrangements are illustrative of the application of the principles of the invention. Numerous other arrangements, including the use of a p-n-p type transistor in the counter to count negative going pulses, may be devised by those skilled in the art without departing from the spirit and scope of the invention.

What is claimed is:

1. A transistor circuit comprising, in combination, a transistor having a base electrode, an emitter electrode, and a collector electrode, a transformer having a primary winding and a secondary winding, biasing means connected between said emitter and collector electrodes by means of said transformer primary winding, means for applying an operating signal to said base to render said transistor conductive, regenerative means to enhance said conductive condition for a predetermined time interval, means for dissipating at a controlled rate the magnetic energy stored in said transformer during the time interval said transistor is conducting, means connected between said secondary winding of said transformer and said base to render said transistor non-conductive after said predetermined time interval until the magnetic energy stored in said transformer core has been dissipated.

2. A transistor circuit comprising, in combination, a transistor having a base electrode, an emitter electrode, and a collector electrode, a transformer having a primary winding and a secondary winding, biasing means connected between said emitter and collector electrodes by means of said transformer primary winding, means for applying an operating signal to said base electrode to render said transistor conductive, positive feedback means connected between said secondary winding and said base electrode to maintain said transistor in a conductive condition following the application of an operating signal until said transformer is saturated, first gating means connected between said secondary winding of said transformer and said base to render said transistor non-conducting after said transformer is saturated, second gating means connected to said first gating means, and means connected to said second gating means to control the dissipation at a controlled rate of the magnetic energy stored in said transformer during the period of time said transistor is conducting.

3. A transistorized divider circuit comprising, in combination, a transistor having a base electrode, an emitter electrode, and a collector electrode, a transformer having a primary winding and a secondary winding, biasing means connected between said emitter and collector electrodes by means of said transformer primary winding, a source of regularly recurring pulses, means for applying said pulses from said pulse source to said base electrode so that a first pulse from said source renders said transistor conductive, positive feedback means connected between said secondary winding and said base electrode to maintain said transistor in a conductive condition following the application of said first pulse until said transformer is saturated, first gating means connected between said secondary winding of said transformer and said base to render said transistor non-conductive despite the presence of further pulses from said pulse source after said transformer is saturated, second gating means connected to said first gating means, and means connected to said second gating means to control the dissipation of the magnetic energy stored in said transformer during the period of time said transistor is conducting so that said energy is dissipated after the occurence of a predetermined number of pulses from said pulse source after which time said first gating means no longer prevents the transistor from conducting.

4. A transistorized counter circuit comprising in combination, a transistor having a base electrode, an emitter electrode and a collector electrode, a transformer having a primary winding and secondary windings, biasing means connected between said emitter and collector electrodes by means of said transformer primary winding, a first source of regularly recurring pulses of a given repetition frequency, means for applying said pulses from said first source to said base electrode so that a first pulse from said first source renders said transistor conductive, a second source of regularly recurring pulses of the same repetition rate as said first pulses and spaced in time between said first pulses, means for applying said pulses from said second source to said base to render said transistor non-conductive, feedback means connected between a first secondary winding and said base electrode to maintain said transistor in a conductive condition during the time interval between the occurrence of a first pulse from said first source and the occurrence of a first pulse from said second source, means connected to a second secondary winding for dissipating at a controlled rate the magnetic energy accumulated during the period of time said transistor is conducting so that said energy is present during a predetermined number of input pulses from said first source after said first input pulse so that said feedback means between said first secondary winding and said base maintains said transistor non-conductive during the presence of said predetermined number of input pulses from said first source following said first pulse from said source.

5. A transistorized binary counter circuit comprising, in combination, a transistor having a base electrode, an emitter electrode and a collector electrode, a transformer having a primary winding and secondary windings, biasing means connected between said emitter and collector electrodes by means of said transformer primary winding, a first source of regularly recurring pulses of a given repetition frequency, means for applying said pulses from said first source to said base electrode so that a first pulse from said first source renders said transistor conductive, a second source of regularly recurring pulses of the same repetition rate as said first pulses and spaced in time between said first pulse, means for applying said pulses from said second source to said base to render said transistor non-conductive, feedback means connected between a first secondary winding and said base electrode to maintain said transistor in a conductive condition during the time interval between the occurrence of a first pulse from said first source and the occurrence of a first pulse from said second source, means connected to a second transformer secondary winding for dissipating at a controlled rate the magnetic energy accumulated in the transformer during the period of time said transistor is conducting so that said energy is present during the occurrence of a second pulse from said first source but has been dissipated by the time of occurrence of a third pulse from said first source so that said fedback means between said first secondary winding and said base maintains said transistor non-conductive during the presence of a second pulse from said first source of pulses.

References Cited in the file of this patent

UNITED STATES PATENTS 3,043,992 Schwartz ---------------- July 10, 1962